(12) United States Patent
Kang et al.

(10) Patent No.: US 11,967,612 B2
(45) Date of Patent: Apr. 23, 2024

(54) METHOD OF MANUFACTURING SEMICONDUCTOR STRUCTURE

(71) Applicant: NANYA TECHNOLOGY CORPORATION, New Taipei (TW)

(72) Inventors: Ting-Cih Kang, New Taipei (TW); Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 230 days.

(21) Appl. No.: 17/643,417

(22) Filed: Dec. 9, 2021

(65) Prior Publication Data

US 2022/0102490 A1 Mar. 31, 2022

Related U.S. Application Data

(62) Division of application No. 16/930,328, filed on Jul. 16, 2020, now Pat. No. 11,456,353.

(51) Int. Cl.
*H01L 29/06* (2006.01)
*H01L 21/02* (2006.01)
*H01L 29/51* (2006.01)

(52) U.S. Cl.
CPC .... *H01L 29/0649* (2013.01); *H01L 21/02008* (2013.01); *H01L 29/517* (2013.01)

(58) Field of Classification Search
CPC ........... H01L 29/0649; H01L 21/02008; H01L 29/517; H01L 2225/06593; H01L 25/0657; H01L 25/50; H01L 24/08; H01L 2224/08; H01L 2224/08145; H01L 24/00; H01L 21/76897; H01L 23/5386
See application file for complete search history.

(56) References Cited

U.S. PATENT DOCUMENTS

| | | |
|---|---|---|
| 2013/0020704 A1 | 1/2013 | Sadaka |
| 2014/0175655 A1 | 6/2014 | Chen et al. |
| 2015/0294963 A1 | 10/2015 | Lin |
| 2020/0161277 A1* | 5/2020 | Lee .................. H01L 21/76898 |
| 2020/0243466 A1 | 7/2020 | Kim et al. |
| 2021/0134747 A1 | 5/2021 | Yang |

* cited by examiner

*Primary Examiner* — Cuong B Nguyen
(74) *Attorney, Agent, or Firm* — CKC & Partners Co., LLC

(57) ABSTRACT

A method of manufacturing a semiconductor structure includes the following steps: providing a first semiconductor wafer, wherein the first semiconductor wafer includes a first dielectric layer and at least one first top metallization structure embedded in the first dielectric layer, and a top surface of the first dielectric layer is higher than a top surface of the first top metallization structure by a first distance; providing a second semiconductor wafer, wherein the second semiconductor wafer includes a second dielectric layer and at least one second top metallization structure embedded in the second dielectric layer, and a top surface of the second top metallization structure is higher than a top surface second dielectric layer of the by a second distance; and hybrid-bonding the first semiconductor wafer and the second semiconductor wafer.

12 Claims, 9 Drawing Sheets

METHOD OF MANUFACTURING SEMICONDUCTOR STRUCTURE

CROSS-REFERENCE TO RELATED APPLICATION

This application is a Divisional Application of the U.S. application Ser. No. 16/930,328, filed Jul. 16, 2020.

BACKGROUND

Field of Invention

The present disclosure relates to a method of manufacturing a semiconductor structure.

Description of Related Art

Semiconductor devices are used in a variety of electronic applications, such as personal computers, cellphones, digital cameras, and other electronic equipment. Semiconductor devices are typically fabricated by sequentially depositing insulating or dielectric layers, conductive layers, and semiconducting layers of material over a semiconductor substrate, and patterning the various material layers using lithography to form circuit components and elements thereon. The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past.

Three-dimensional integrated circuits (3DICs) are a recent development in semiconductor packaging in which multiple semiconductor dies are stacked upon one another, such as package-on-package (POP) and system-in-package (SIP) packaging techniques. Some 3DICs are prepared by placing dies over dies on a semiconductor wafer level. 3DICs provide improved integration density and other advantages, such as faster speeds and higher bandwidth, because of the decreased length of interconnects between the stacked dies, as examples. However, there are still many challenges related to 3DICs.

SUMMARY

The present disclosure relates in general to a semiconductor structure and a method of manufacturing the semiconductor structure.

According to an embodiment of the present disclosure, the method of manufacturing a semiconductor structure includes the following steps: providing a first semiconductor wafer, wherein the first semiconductor wafer includes a first dielectric layer and at least one first top metallization structure embedded in the first dielectric layer, and a top surface of the first dielectric layer is higher than a top surface of the first top metallization structure by a first distance; providing a second semiconductor wafer, wherein the second semiconductor wafer includes a second dielectric layer and at least one second top metallization structure embedded in the second dielectric layer, and a top surface of the second top metallization structure is higher than a top surface second dielectric layer of the by a second distance; and hybrid-bonding the first semiconductor wafer and the second semiconductor wafer.

In some embodiments of the present disclosure, the second distance is smaller than the first distance.

In some embodiments of the present disclosure, a difference between the first distance and the second distance depends at least in part on conductive thermal expansion coefficients of the first top metallization structure and the second top metallization structure.

In some embodiments of the present disclosure, the method of manufacturing the semiconductor structure further includes: placing the first semiconductor wafer vertically on the second semiconductor wafer, such that the first dielectric layer is in contact with the second dielectric layer while leaving a gap between the first top metallization structure and the second top metallization structure.

In some embodiments of the present disclosure, the first distance minus the second distance equals to a vertical length of the gap.

In some embodiments of the present disclosure, hybrid-bonding the first semiconductor wafer and the second semiconductor wafer includes: performing an annealing process such that the first top metallization structure and the second top metallization structure undergo a thermal expansion to fill the gap.

In some embodiments of the present disclosure, providing the first semiconductor wafer includes: forming an etch stop layer in the first semiconductor wafer; and forming the first dielectric layer and the first top metallization structure vertically on the etch stop layer.

In some embodiments of the present disclosure, providing the first semiconductor wafer includes: forming at least one recess vertically through the first dielectric layer, such that a portion of the etch stop layer is exposed; and filling the recess with the first top metallization structure.

In some embodiments of the present disclosure, providing the first semiconductor wafer includes: recessing the first top metallization structure to fall below the top surface of the first dielectric layer.

In some embodiments of the present disclosure, providing the first semiconductor wafer includes: forming at least one conductive plug vertically through the etch stop layer.

In some embodiments of the present disclosure, providing the first semiconductor wafer includes: forming an etch stop layer vertically on the second dielectric layer, wherein a thickness of the etch stop layer is substantially equal to the second distance.

In some embodiments of the present disclosure, providing the second semiconductor wafer includes: forming at least one recess vertically through the etch stop layer and the second dielectric layer; and filling the recess with the second top metallization structure, such that the top surface of the second top metallization structure is substantially coplanar with a top surface of the etch stop layer.

In some embodiments of the present disclosure, providing the second semiconductor wafer includes: removing the etch stop layer, such that a portion of a sidewall of the second top metallization is exposed.

According to an embodiment of the present disclosure, a semiconductor structure includes a lower dielectric layer, at least one lower metallization structure, an upper dielectric layer, and at least one upper metallization structure. The lower metallization structure is embedded in the lower dielectric layer. The upper dielectric layer forms a dielectric-to-dielectric bond with the lower dielectric layer. The upper metallization structure is embedded in the upper dielectric layer and forms a metal-to-metal bond with the lower top metallization structure. The dielectric-to-dielectric bond and the metal-to-metal bond are located at different levels.

In some embodiments of the present disclosure, the metal-to-metal bond is laterally surrounded by the upper dielectric layer.

In some embodiments of the present disclosure, the lower metallization structure and the upper metallization structure include a same material.

In some embodiments of the present disclosure, the semiconductor structure further includes an etch stop layer laterally extending over the upper dielectric layer and the upper metallization structure.

In some embodiments of the present disclosure, the semiconductor structure further includes at least one conductive plug vertically through the etch stop layer and in contact with the upper metallization structure.

In some embodiments of the present disclosure, the semiconductor structure further includes at least one top metallization structure, and the conductive plug is vertically between the top metallization structure and the upper metallization structure.

In some embodiments of the present disclosure, the semiconductor structure further includes at least one bottom metallization structure and at least one conductive plug vertically between the lower metallization structure and the bottom metallization structure.

In the aforementioned embodiments of the present disclosure, since the top surface of the first top metallization structure is lower than the top surface of the first dielectric layer by the first distance, and the top surface of the second top metallization structure is higher than the top surface of the second dielectric layer by the second distance, a gap is preserved for the first top metallization structure and the second top metallization structure to undergo a thermal expansion during the hybrid-bonding process. As a result, the bonding between the first top metallization structure and the second top metallization structure can be accurate and tight without generating any void therebetween, and hence a high bonding strength between the first semiconductor wafer and the second semiconductor wafer can be well achieved. In addition, the semiconductor structure manufactured by such a process may include a first interface between the first dielectric layer and the second dielectric layer and a second interface between the first top metallization structure and the second top metallization structure, in which the first interface and the second interface are vertically located at different levels.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
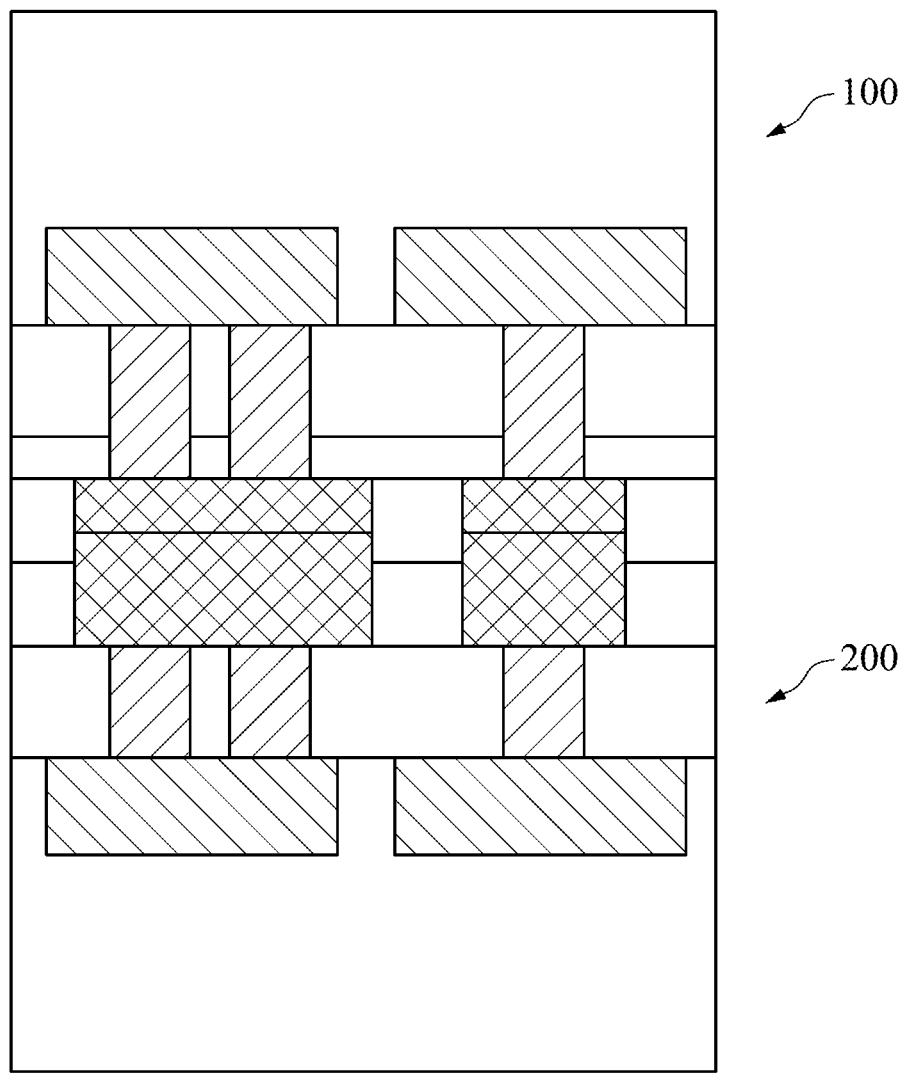
FIG. 1 is a cross-sectional view illustrating a semiconductor structure according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In the present disclosure, a semiconductor structure and a method of manufacturing the same are provided. FIG. 1 is a cross-sectional view illustrating a semiconductor structure 300 according to some embodiments of the present disclosure. The semiconductor structure 300 includes a first semiconductor wafer 100 and a second semiconductor wafer 200 vertically disposed on the first semiconductor wafer 100. The semiconductor structure 300 is manufactured by a hybrid-bonding process. For the purpose of simplicity and clarity, the method of manufacturing the semiconductor structure 300 will be discussed first in the article.

Figure 2:
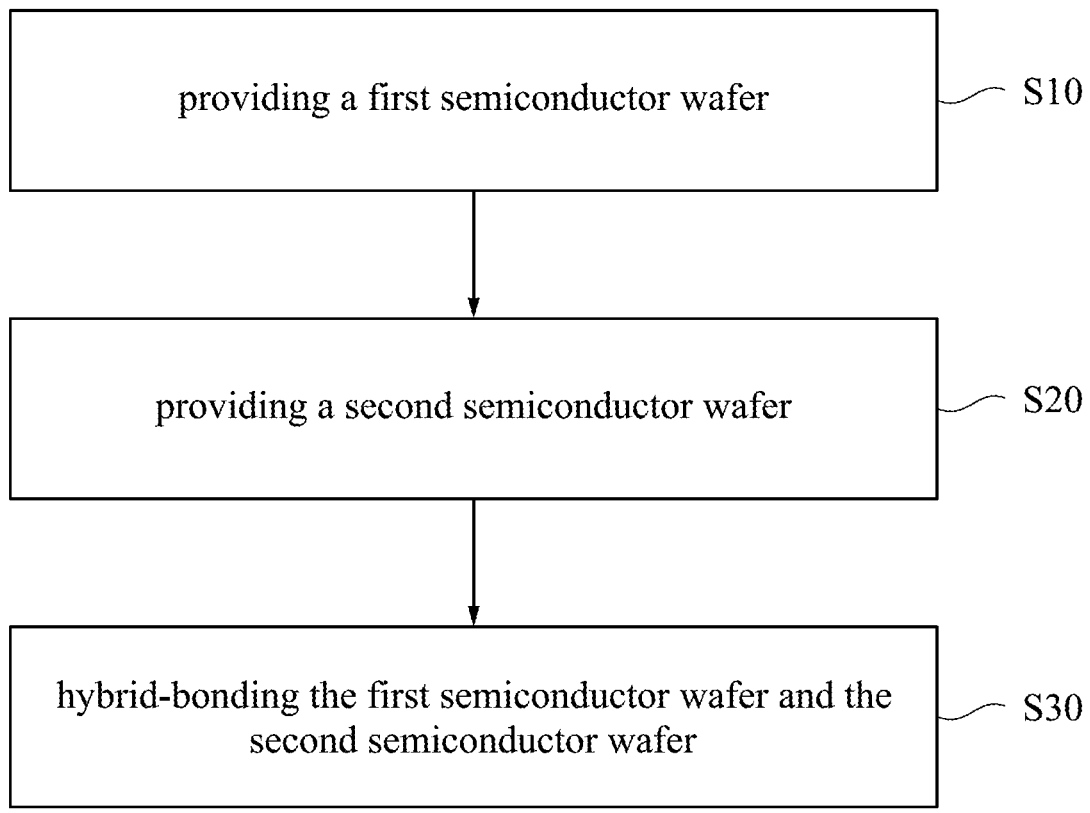
FIG. 2 is a flowchart illustrating a method of manufacturing the semiconductor structure shown in FIG. 1 according to some embodiments of the present disclosure.

FIG. 2 is a flowchart illustrating a method of manufacturing the semiconductor structure 300 shown in FIG. 1 according to some embodiments of the present disclosure. The method of manufacturing the semiconductor structure 300 includes the following steps. In step S10, providing a first semiconductor wafer, in which the first semiconductor wafer includes a first dielectric layer and at least one first top metallization structure embedded in the first dielectric layer, and a top surface of the first dielectric layer is higher than a top surface of the first top metallization structure by a first distance. In step S20, providing a second semiconductor wafer, in which the second dielectric layer includes a second dielectric layer and at least one second top metallization structure embedded in the second dielectric layer, and a top surface of the second top metallization structure is higher than a top surface second dielectric layer of the by a second distance. In step S30, hybrid-bonding the first semiconductor wafer and the second semiconductor wafer. The aforementioned steps will further be discussed in the following descriptions with the accompany of FIGS. 3-13, which are cross-sectional views illustrating a method of manufacturing the semiconductor structure 300 shown in FIG. 1 at various stages according to some embodiments of the present disclosure.

Figure 3:
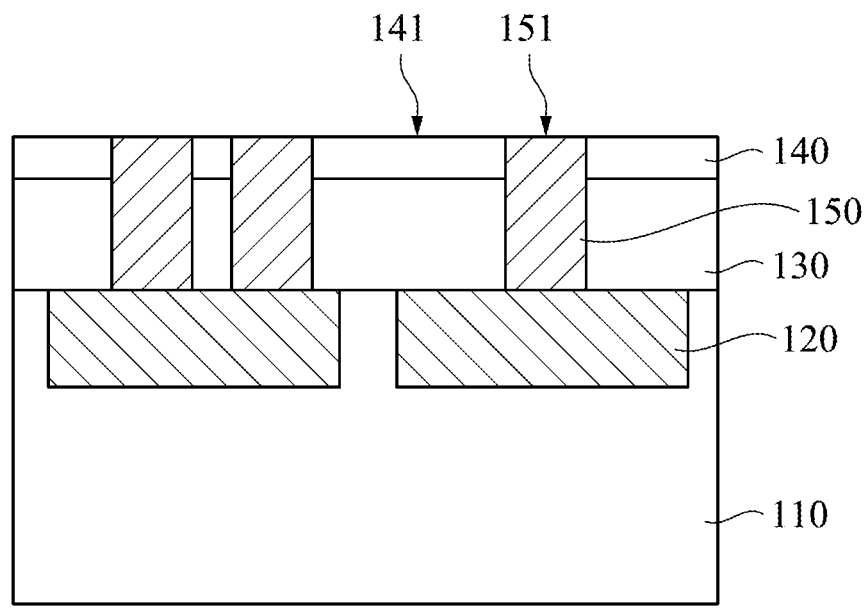
FIGS. 3-13 are cross-sectional views illustrating a method of manufacturing the semiconductor structure shown in FIG. 1 at various stages according to some embodiments of the present disclosure.

Reference is made to FIG. 3. A first substrate 110 is provided with at least one first bottom metallization structure 120 being embedded therein. A first insulating layer 130 is then formed vertically on the first substrate 110 and covers the first bottom metallization structure 120. In some embodiments, the first insulating layer 130 may include dielectric materials such as oxide. A first etch stop layer 140 is then formed vertically on the first insulating layer 130. In some embodiments, the first etch stop layer 140 may include dielectric materials such as SiCN, SiN, $Si_3N_4$, other suitable dielectric materials or combinations thereof. After that, at least one first conductive plug 150 is formed through the first etch stop layer 140 and the first insulating layer 130, such that the first conductive plug 150 is in contact with the first bottom metallization structure 120. In some embodiments, the first conductive plug 150 is formed by depositing a conductive material in a through hole penetrating through the first etch stop layer 140 and the first insulating layer 130 and on the first etch stop layer 140, and subsequently followed by a chemical mechanical polishing (CMP) process to remove a portion of the conductive material outside the through hole. As a result, a top surface 151 of the first conductive plug 150 can be substantially coplanar with a top surface 141 of the first etch stop layer 140.

Figure 4:
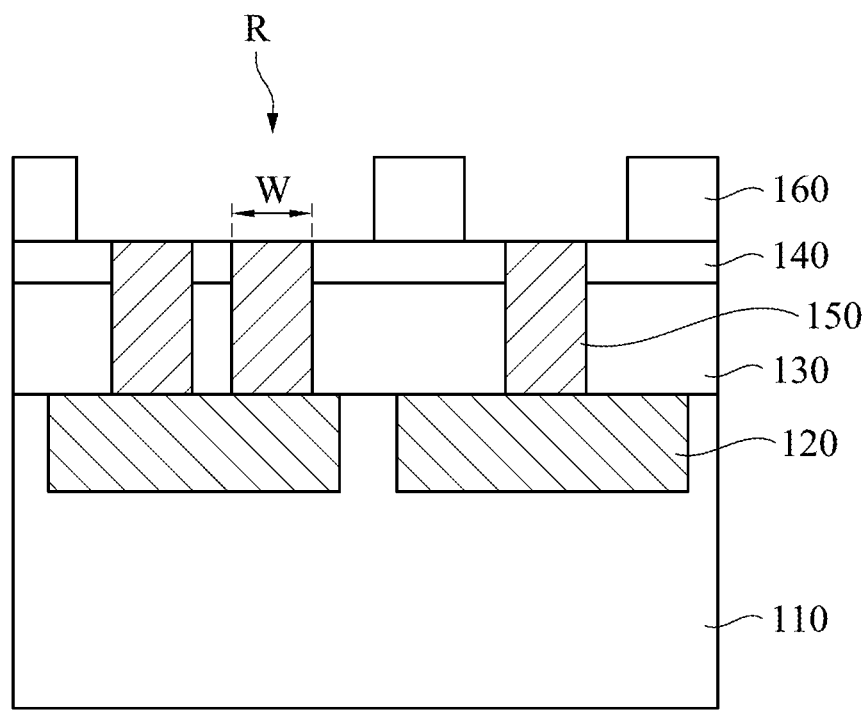

Reference is made to FIG. 4. A first dielectric layer 160 is then formed vertically on the first etch stop layer 140. In some embodiments, the first dielectric layer 160 may include dielectric materials such as oxide. After that, at least one recess R is subsequently formed through the first dielectric layer 160, such that the first conductive plug 150 and a portion of the first etch stop layer 140 are exposed through the recess R. In some embodiments, the recess R can be formed by an etching process. The first etch stop layer 140 can prevent the recess R from being over-etched into the first conductive plug 150, such that an alignment of a first top metallization structure to be formed in the recess R in the following steps can be achieved. In some embodiments, a number of the first conductive plug 150 is plural, and the recess R is formed to expose more than one first conductive plug 150. In this case, lateral widths W of the first conductive plugs 150 are designed to be identical, such that the etching process is better controlled, and an alignment of a first top metallization structure to be formed in the recess R in the following steps can be further achieved.

Figure 5:
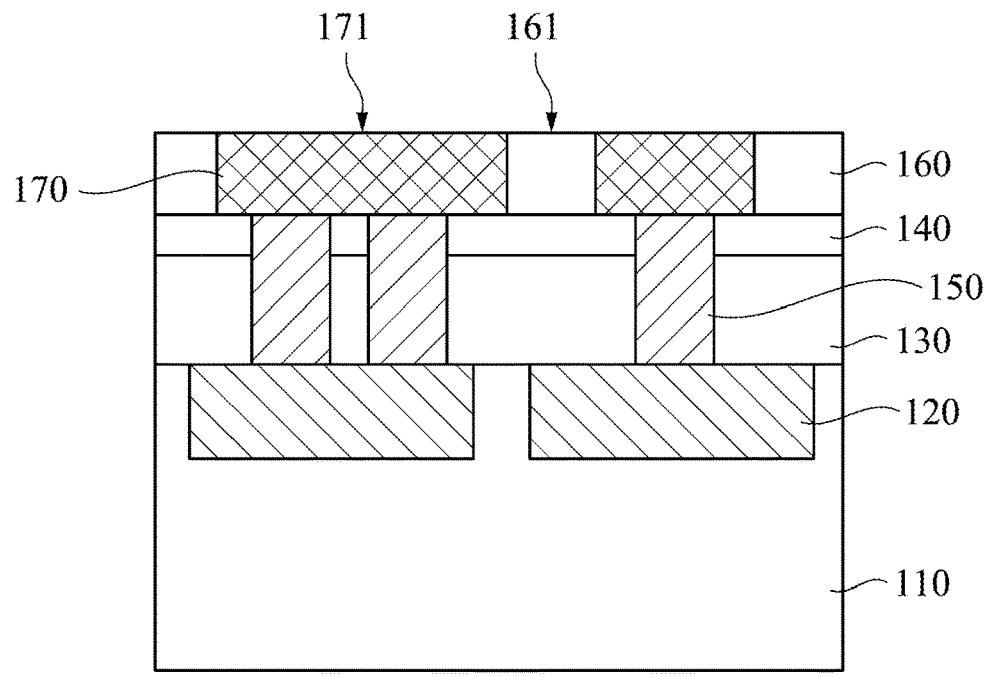

Reference is made to FIG. 5. At least one first top metallization structure 170 is filled in the recess R, such that the first top metallization structure 170 is vertically formed on the first etch stop layer 140. In some embodiments, the first top metallization structure 170 is formed by depositing a conductive material in the recess R and on the first dielectric layer 160, and subsequently followed by a CMP process to remove a portion of the conductive material outside the recess R. As a result, a top surface 171 of the first top metallization structure 170 can be substantially coplanar with a top surface 161 of the first dielectric layer 160, and the first top metallization structure 170 can be connected to the first bottom metallization structure 120 through the first conductive plug 150. In some embodiments, the first bottom metallization structure 120, the first conductive plug 150, and the first top metallization structure 170 may include a same material. In alternative embodiments, any two of the first bottom metallization structure 120, the first conductive plug 150, and the first top metallization structure 170 may include a same material. In other embodiments, the first bottom metallization structure 120, the first conductive plug 150, and the first top metallization structure 170 may include different materials.

Figure 6:
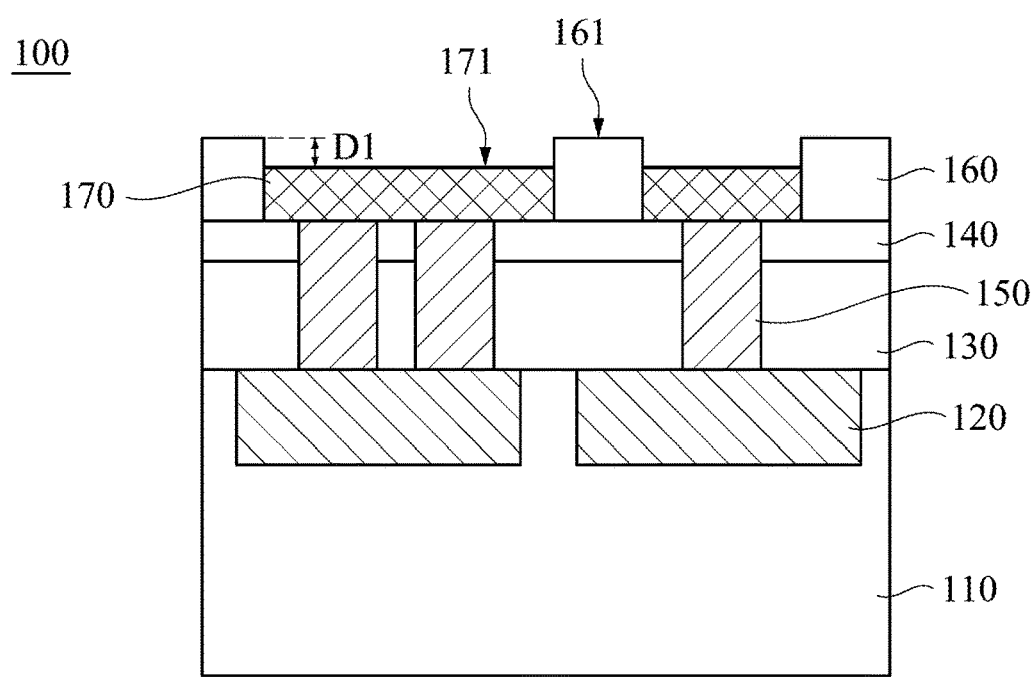

Reference is made to FIG. 6. A top portion of the first top metallization structure 170 is then removed by using, e.g., a selective etching process that etches the metal material of the top metallization structure 170 at a faster etch rate than it etches the dielectric material of the first dielectric layer 160, such that the top surface 161 of the first dielectric layer 160 is higher than the top surface 171 of the first top metallization structure 170. In some embodiments, the top surface 161 of the first dielectric layer 160 is higher than the top surface 171 of the first top metallization structure 170 by a first distance D1. The first distance D1 is designed to preserve a gap for the hybrid-bonding process performed in the following steps (which will be discussed later in the following descriptions). In some embodiments, the top portion of the first top metallization structure 170 is removed by a selective etching process with time control, such that a height difference between the top surface 161 of the first dielectric layer 160 and the top surface 171 of the first top metallization structure 170 can be accurately controlled to be substantially equal to the first distance D1. After the removal of the top portion of the first top metallization structure 170, the first semiconductor wafer 100 is provided as mentioned above in step S10.

Figure 7:
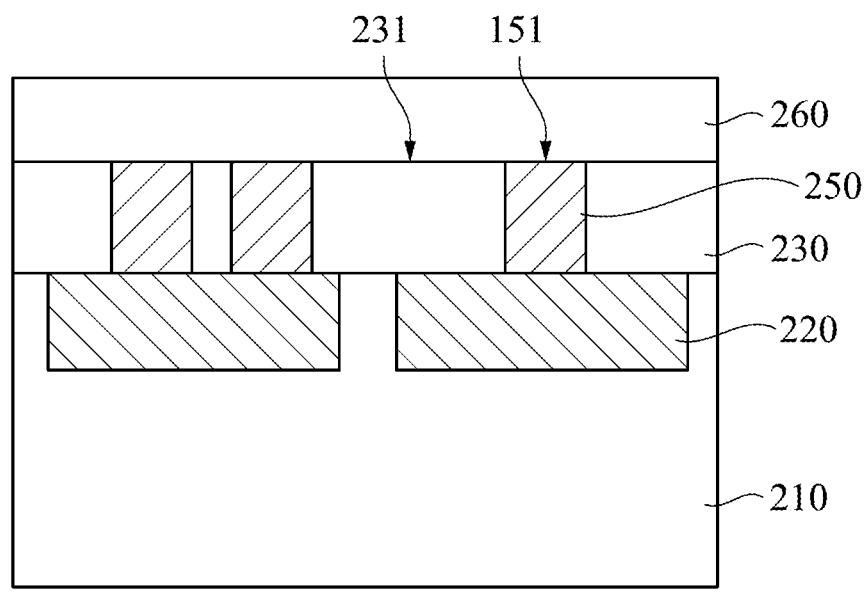

Reference is made to FIG. 7. A second substrate 210 is provided with at least one second bottom metallization structure 220 being embedded therein. A second insulating layer 230 is then formed vertically on the second substrate 210 and covers the second bottom metallization structure 220. In some embodiments, the second insulating layer 230 may include dielectric materials such as oxide. After that, at least one second conductive plug 250 is formed through the second insulating layer 230, such that the second conductive plug 250 is in contact with the second bottom metallization structure 220. In some embodiments, the second conductive plug 250 is formed by depositing a conductive material in a through hole penetrating through the second insulating layer 230 and on the second insulating layer 230, and subsequently followed by a CMP process to remove a portion of the conductive material outside the through hole. As a result, a top surface 251 of the second conductive plug 250 can be substantially coplanar with a top surface 231 of the second insulating layer 230. A second dielectric layer 260 is then formed vertically on the second insulating layer 230 and covers the second conductive plug 250. In some embodiments, the second dielectric layer 260 may include dielectric materials such as oxide. In some embodiments, the second insulating layer 230 and the second dielectric layer 260 may include a same material. In alternative embodiments, the second insulating layer 230 and the second dielectric layer 260 may include different materials.

Figure 8:
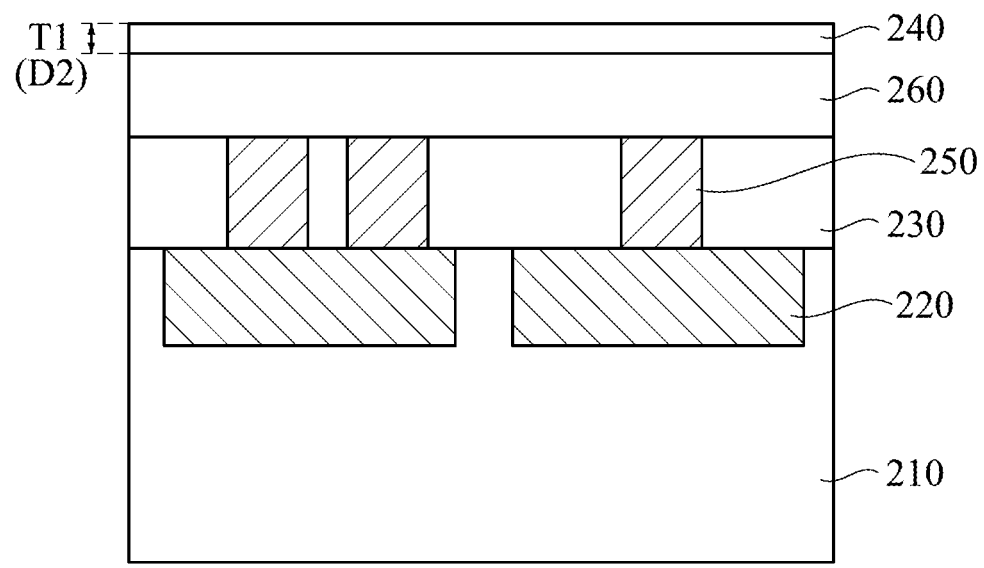

Reference is made to FIG. 8. A second etch stop layer 240 is then formed vertically on the second dielectric layer 260. In some embodiments, the second etch stop layer 240 may include dielectric materials such as SiCN, SiN, $Si_3N_4$, other suitable dielectric materials or combinations thereof. In some embodiments, a thickness T1 of the second etch stop layer 240 is substantially equal to a second distance D2, in which the second distance D2 is smaller than the first distance D1. More specifically, the second distance D2 is predetermined by the first distance D1, such that the second distance D2 is smaller than the first distance D1. Advantages of such a design will further be discussed later in the following descriptions.

Figure 9:
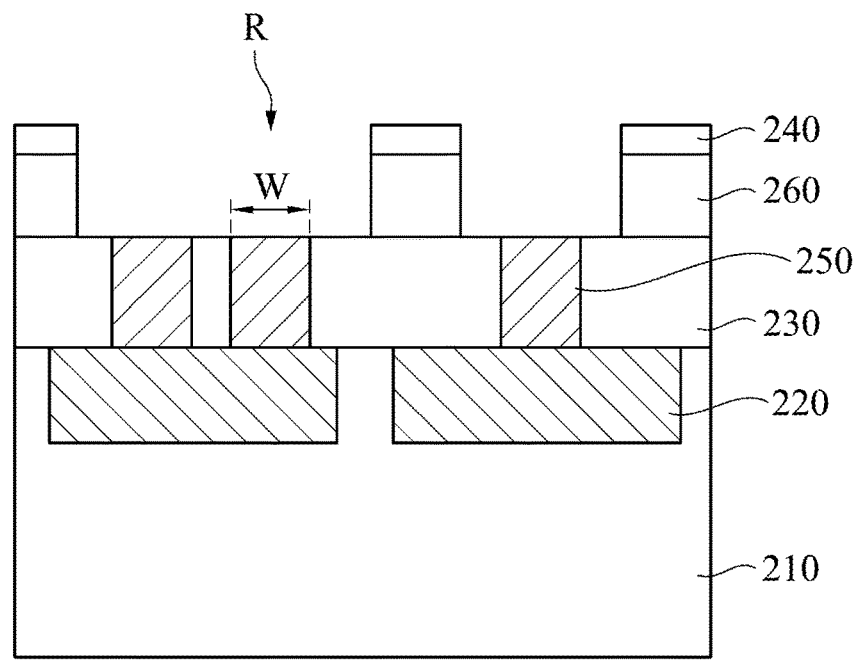

Reference is made to FIG. 9. At least one recess R is subsequently formed through the second etch stop layer 240 and the second dielectric layer 260, such that the second conductive plug 250 and a portion of the second insulating layer 230 are exposed through the recess R. In some embodiments, the recess R can be formed by an etching process. In some embodiments, a number of the second conductive plug 250 is plural, and the recess R is formed to expose more than one second conductive plug 250. In this case, lateral widths W of the second conductive plugs 250 are designed to be identical, such that the etching process is better controlled, and an alignment of a second top metallization structure to be formed in the recess R in the following steps can be further achieved.

Figure 10:
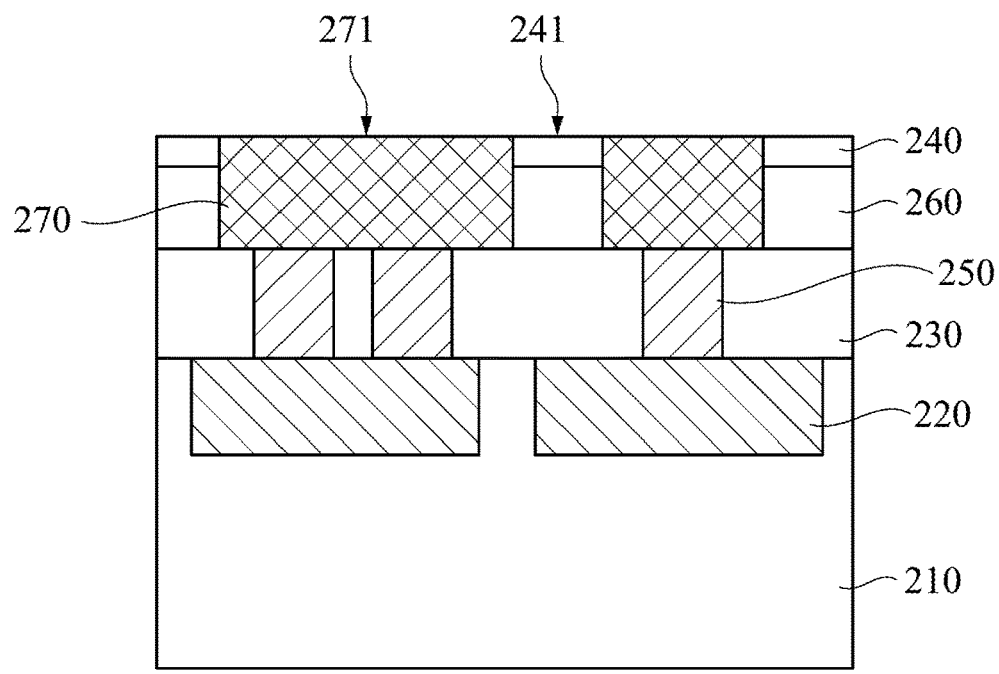

Reference is made to FIG. 10. At least one second top metallization structure 270 is filled in the recess R, such that the second top metallization structure 270 is vertically formed on the second insulating layer 230. In some embodiments, the second top metallization structure 270 is formed by depositing a conductive material in the recess R and on the second etch stop layer 240, and subsequently followed by a CMP process to remove a portion of the conductive material outside the recess R. As a result, a top surface 271 of the second top metallization structure 270 can be substantially coplanar with a top surface 241 of the second etch stop layer 240, and the second top metallization structure 270 can be connected to the second bottom metallization structure 220 through the second conductive plug 250. In some embodiments, the second bottom metallization structure 220, the second conductive plug 250, and the second top metallization structure 270 may include a same material. In alternative embodiments, any two of the second bottom metallization structure 220, the second conductive plug 250, and the second top metallization structure 270 may include a same material. In other embodiments, the second bottom metallization structure 220, the second conductive plug 250, and the second top metallization structure 270 may include different materials.

Figure 11:
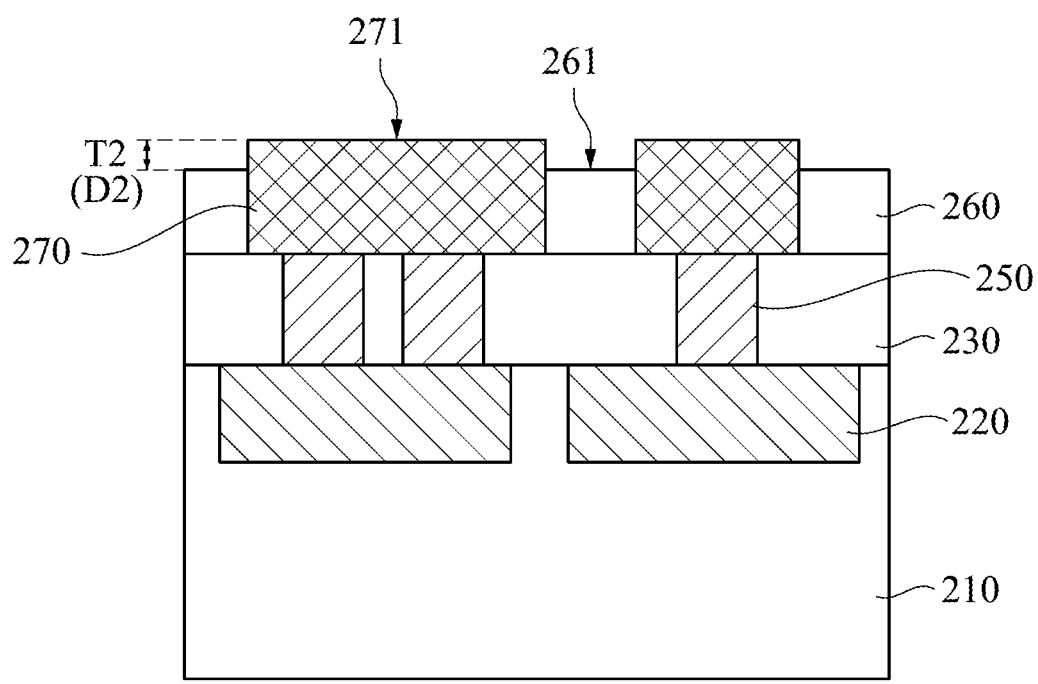

Reference is made to FIG. 11. The second etch stop layer 240 is then removed by, for example, a selective etching process that etches the dielectric material of the etch stop layer 240 at a faster etch rate than it etches the metal material of the metallization structure 270, such that a top portion of a sidewall of the second top metallization structure 270 is exposed. Since the thickness T1 of the second etch stop layer 240 (see FIG. 8) is substantially equal to the second distance D2, a thickness T2 of the top portion of the second top metallization structure 270 exposed will also be substantially equal to the second distance D2. Stated differently, the top surface 271 of the second top metallization structure 270 is higher than a top surface 261 of the second dielectric layer 260 by the second distance D2. Since a height difference between the top surface 271 of the second top metallization structure 270 and the top surface 261 of the second dielectric layer 260 is predetermined by the thickness T1 of the second etch stop layer 240 (see FIG. 8), the height difference can be accurately formed to be substantially equal to the second distance D2 by simply removing the second etch stop layer 240 without the needs to perform an etching process with time control, which is more complicated and may result in an inaccuracy of the height difference. After the removal of the etch stop layer 240, the second semiconductor wafer 200 is provided as mentioned above in step S20.

Figure 12:
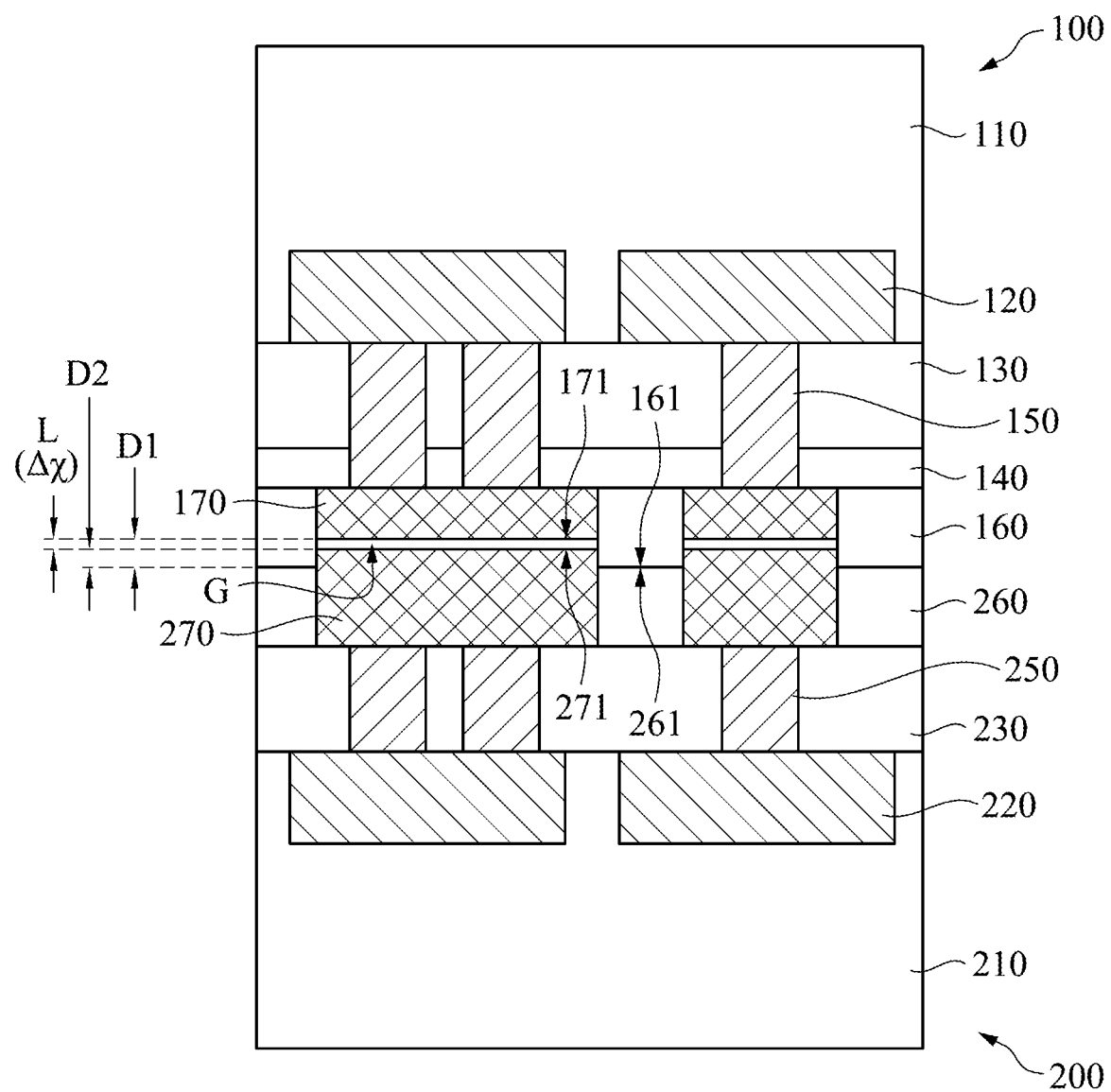

Reference is made to FIG. 12. The first semiconductor wafer 100 is then placed vertically on the second semiconductor wafer 200, such that the second dielectric layer 260 of the second semiconductor wafer 200 is vertically aligned with the first dielectric layer 160 of the first semiconductor wafer 100, and the second top metallization structure 270 of the second semiconductor wafer 200 is vertically aligned with the first top metallization structure 170 of the first semiconductor wafer 100 for the following hybrid-bonding process. Stated differently, the first semiconductor wafer 100 is placed upside down with respect to the second semiconductor wafer 200. As a result, the second dielectric layer 260 is in contact with the first dielectric layer 160, and since the top surface 171 of the first top metallization structure 170 is lower than the top surface 161 of the first dielectric layer 160 by the first distance D1, the top surface 271 of the second top metallization structure 270 is higher than the top surface 261 of the second dielectric layer 260 by the second distance D2, and the second distance D2 is predetermined to be smaller than the first distance D1, a gap G is formed between the first top metallization structure 170 and the second top metallization structure 270 to be preserved for the first top metallization structure 170 and the second top metallization structure 270 to undergo a thermal expansion during the following hybrid-bonding process.

In some embodiments, the first distance D1 further depends on conductive thermal expansion coefficients of the first top metallization structure 170 and the second top metallization structure 270. More specifically, a relationship between the first distance D1 and the second distance D2 may be represented as: $D1=D2+\Delta X$, in which $\Delta X$ is an expected metal thermal expansion size and depends on conductive thermal expansion coefficients of the first top metallization structure 170 and the second top metallization structure 270. In such a case, a vertical length L of the gap G is substantially equal to the expected metal thermal expansion size $\Delta X$. In some embodiments, the expected metal thermal expansion size $\Delta X$ further depends on the metal materials of the first top metallization structure 170 and the second top metallization structure 270. Therefore, by determining the expected metal thermal expansion size $\Delta X$ according to the metal materials used in the first top metallization structure 170 and the second top metallization structure 270, the hybrid-bonding between the first semiconductor wafer 100 and the second semiconductor wafer 200 can further be well achieved.

Figure 13:
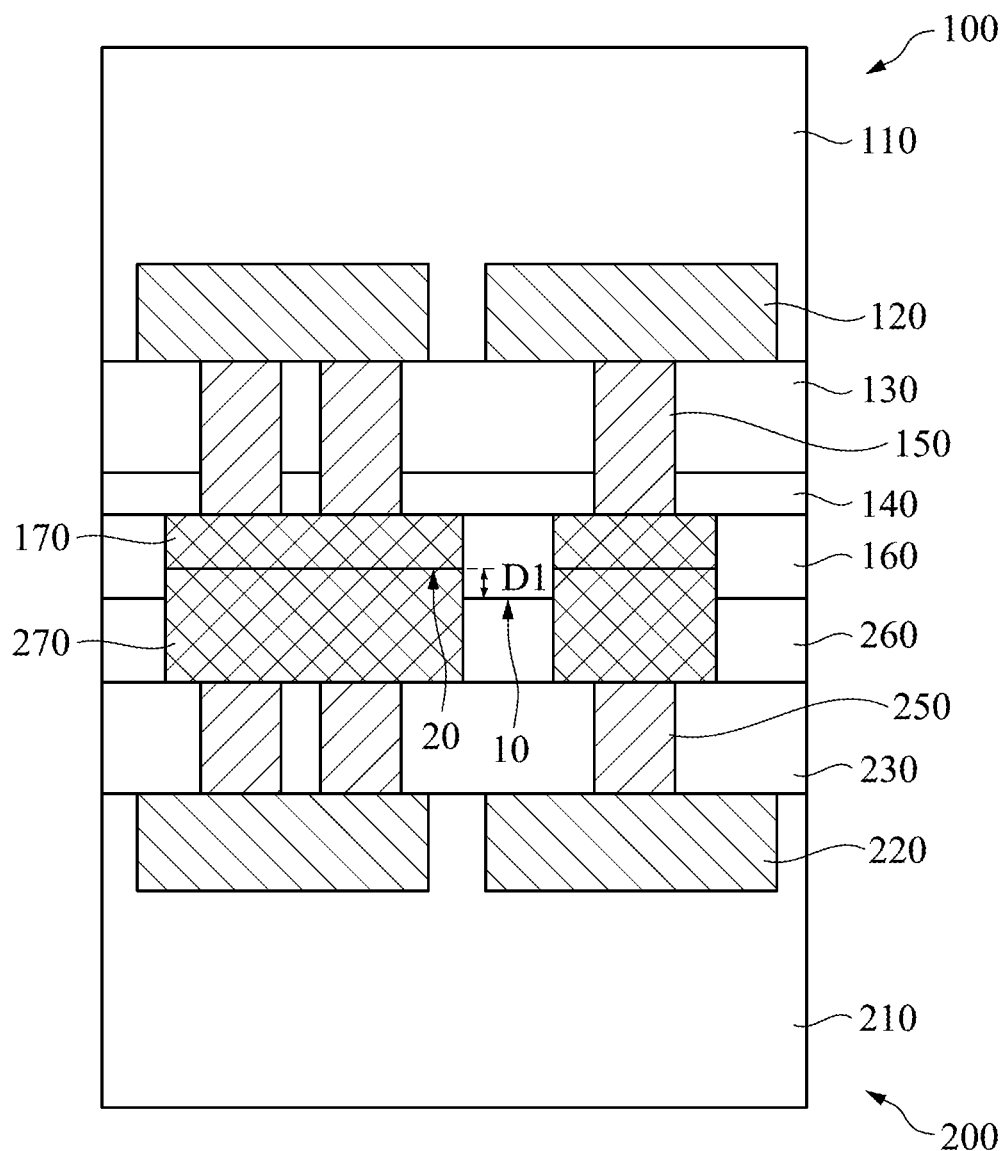

Reference is made to FIG. 13. In step S30 as mentioned above, the hybrid-bonding process is then performed such that the first semiconductor wafer 100 is bonded to the second semiconductor wafer 200. More specifically, an annealing process is performed such that the first top metallization structure 170 and the second top metallization structure 270 undergo a thermal expansion to eventually fill the gap G. As such, the bonding between the first top metallization structure 170 and the second top metallization structure 270 can be accurate and tight without generating any void therebetween, and hence a high bonding strength between the first semiconductor wafer 100 and the second semiconductor wafer 200 can be well achieved.

After step S30 shown in FIG. 13, the semiconductor structure 300 of the present disclosure is formed. The semiconductor structure 300 includes the first semiconductor wafer 100 and the second semiconductor wafer 200 vertically disposed on the first semiconductor wafer 100. The first semiconductor wafer 100 includes the first dielectric layer 160 and the first top metallization structure 170 embedded in the first dielectric layer 160. The second semiconductor wafer 200 includes the second dielectric layer 260 and the second top metallization structure 270 embedded in the second dielectric layer 260. The first dielectric layer 160 is bonded to the second dielectric layer 260, and the first top metallization structure 170 is bonded to the second top metallization structure 270. In some embodiments, the first top metallization structure 170 and the second top metallization structure 270 may include a same conductive material. In alternative embodiments, the first top metallization structure 170 and the second top metallization structure 270 may include different conductive materials.

In some embodiments, a dielectric-to-dielectric bond 10 (e.g., resulting from a hybrid-bonding process) is between the first dielectric layer 160 and the second dielectric layer 260, and a metal-to-metal bond 20 (e.g., resulting from a hybrid-bonding process) is between the first top metallization structure 170 and the second top metallization structure 270. In some embodiments, the dielectric-to-dielectric bond results in an observable dielectric-to-dielectric interface and/or intermixing region of dielectric materials (e.g., depending on temperature and/or duration time of annealing of the hybrid-bonding), and the metal-to-metal bond results in an observable metal-to-metal interface and/or intermixing region of metal materials (e.g., depending on temperature and/or duration time of annealing of the hybrid-bonding).

In some embodiments, the dielectric-to-dielectric bond 10 and the metal-to-metal bond 20 are vertically located at different levels. For example, the dielectric-to-dielectric bond 10 may be located between the first semiconductor wafer 100 and the second semiconductor wafer 200, while the metal-to-metal bond 20 may be laterally surrounded by the first dielectric layer 160 of the first semiconductor wafer 100. Furthermore, a distance D between the dielectric-to-dielectric bond 10 and the metal-to-metal bond 20 may be substantially equal to the first distance D1 as previously mentioned.

In some embodiments, the first semiconductor wafer 100 of the semiconductor structure 300 further includes the first substrate 110 and the first bottom metallization structure 120 embedded in the first substrate 110, and the second semiconductor wafer 200 of the semiconductor structure 300 further includes the second substrate 210 and the second bottom metallization structure 220 embedded in the second substrate 210. In some embodiments, the first semiconductor wafer 100 of the semiconductor structure 300 further includes the first conductive plug 150 vertically disposed between the first top metallization structure 170 and the first bottom metallization structure 120, and the second semiconductor wafer 200 of the semiconductor structure 300 further includes the second conductive plug 250 vertically disposed between the second top metallization structure 270 and the second bottom metallization structure 220. The first conductive plug 150 is in contact with the first top metallization structure 170 and the first bottom metallization structure 120 to make electrical connections therebetween, and the second conductive plug 250 is in contact with the second top metallization structure 270 and the second bottom metallization structure 220 to make electrical connections therebetween. As a result, electrical connections between the first semiconductor wafer 100 and the second semiconductor wafer 200 can further be made by the bonding between the first top metallization structure 170 and the second top metallization structure 270.

In some embodiments, since the first etch stop layer 140 is preserved in the first semiconductor wafer 100 during the manufacturing process of the semiconductor structure 300, the first semiconductor wafer 100 of the semiconductor structure 300 may include the first etch stop layer 140 laterally extending over the first dielectric layer 160 and the first top metallization structure 170. In some embodiments, the first conductive plug 150 may penetrate through the first etch stop layer 140 to make electrical connections between the first top metallization structure 170 and the first bottom metallization structure 120.

According to the aforementioned embodiments of the present disclosure, since the top surface of the first top metallization structure is lower than the top surface of the first dielectric layer by the first distance, and the top surface of the second top metallization structure is higher than the top surface of the second dielectric layer by the second distance, a gap is preserved for the first top metallization structure and the second top metallization structure to undergo a thermal expansion during the hybrid-bonding process. As a result, the bonding between the first top metallization structure and the second top metallization structure can be accurate and tight without generating any void therebetween, and hence a high bonding strength between the first semiconductor wafer and the second semiconductor wafer can be well achieved. In addition, the semiconductor structure manufactured by such a process may include a first interface between the first dielectric layer and the second dielectric layer and a second interface between the first top metallization structure and the second top metallization structure, in which the first interface and the second interface are vertically located at different levels.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A method of manufacturing a semiconductor structure, comprising:
    providing a first semiconductor wafer, wherein the first semiconductor wafer comprises a first dielectric layer and at least one first top metallization structure embedded in the first dielectric layer, and a top surface of the first dielectric layer is higher than a top surface of the first top metallization structure by a first distance;
    providing a second semiconductor wafer, wherein the second semiconductor wafer comprises a second dielectric layer and at least one second top metallization structure embedded in the second dielectric layer, and a top surface of the second top metallization structure is higher than a top surface of the second dielectric layer by a second distance, wherein providing the second semiconductor wafer comprises:
        forming an etch stop layer vertically on the second dielectric layer, wherein a thickness of the etch stop layer is substantially equal to the second distance; and
    hybrid-bonding the first semiconductor wafer and the second semiconductor wafer.

2. The method of manufacturing the semiconductor structure of claim 1, wherein the second distance is smaller than the first distance.

3. The method of manufacturing the semiconductor structure of claim 1, wherein a difference between the first distance and the second distance depends at least in part on conductive thermal expansion coefficients of the first top metallization structure and the second top metallization structure.

4. The method of manufacturing the semiconductor structure of claim 1, further comprising:
    placing the first semiconductor wafer vertically on the second semiconductor wafer, such that the first dielectric layer is in contact with the second dielectric layer while leaving a gap between the first top metallization structure and the second top metallization structure.

5. The method of manufacturing the semiconductor structure of claim 4, wherein the first distance minus the second distance equals to a vertical length of the gap.

6. The method of manufacturing the semiconductor structure of claim 4, wherein hybrid-bonding the first semiconductor wafer and the second semiconductor wafer comprises:
    performing an annealing process such that the first top metallization structure and the second top metallization structure undergo a thermal expansion to fill the gap.

7. The method of manufacturing the semiconductor structure of claim 1, wherein providing the first semiconductor wafer comprises:
    forming an etch stop layer in the first semiconductor wafer; and
    forming the first dielectric layer and the first top metallization structure vertically on the etch stop layer.

8. The method of manufacturing the semiconductor structure of claim 7, wherein providing the first semiconductor wafer comprises:
    forming at least one recess vertically through the first dielectric layer, such that a portion of the etch stop layer is exposed; and
    filling the recess with the first top metallization structure.

9. The method of manufacturing the semiconductor structure of claim 8, wherein providing the first semiconductor wafer comprises:
   recessing the first top metallization structure to fall below the top surface of the first dielectric layer.

10. The method of manufacturing the semiconductor structure of claim 7, wherein providing the first semiconductor wafer comprises:
    forming at least one conductive plug vertically through the etch stop layer.

11. The method of manufacturing the semiconductor structure of claim 1, wherein providing the second semiconductor wafer comprises:
    forming at least one recess vertically through the etch stop layer and the second dielectric layer; and
    filling the recess with the second top metallization structure, such that the top surface of the second top metallization structure is substantially coplanar with a top surface of the etch stop layer.

12. The method of manufacturing the semiconductor structure of claim 11, wherein providing the second semiconductor wafer comprises:
    removing the etch stop layer, such that a portion of a sidewall of the second top metallization structure is exposed.

\* \* \* \* \*